United States Patent [19]

Wiech, Jr.

[11] Patent Number: 4,519,447
[45] Date of Patent: May 28, 1985

[54] SUBSTRATE COOLING

[75] Inventor: Raymond E. Wiech, Jr., San Diego, Calif.

[73] Assignee: Fine Particle Technology Corporation, Camarillo, Calif.

[21] Appl. No.: 584,309

[22] Filed: Mar. 5, 1984

Related U.S. Application Data

[60] Division of Ser. No. 468,665, Feb. 22, 1983, abandoned, which is a continuation-in-part of Ser. No. 174,929, Aug. 4, 1980, Pat. No. 4,374,457.

[51] Int. Cl.$^3$ .................. F28D 15/00; H01L 23/46
[52] U.S. Cl. ..................... 165/104.33; 165/104.23; 165/104.28; 417/50; 357/82; 361/385
[58] Field of Search ............... 165/104.33, 104.23, 165/104.28; 417/50; 357/82; 361/385, 382

[56] References Cited

U.S. PATENT DOCUMENTS

| | | | |
|---|---|---|---|
| 2,748,356 | 5/1956 | Kaehni | 165/104.19 |
| 3,287,677 | 11/1966 | Mohr | 417/50 |
| 3,327,776 | 6/1967 | Butt | 165/170 X |
| 3,812,404 | 5/1974 | Barkan et al. | 165/104.33 |
| 4,037,270 | 7/1977 | Ahmann et al. | 361/385 |
| 4,268,850 | 5/1981 | Lazarek et al. | 357/82 |
| 4,327,399 | 4/1982 | Sasaki et al. | 361/385 |

FOREIGN PATENT DOCUMENTS 35843 3/1980 Japan .................. 165/104.26

Primary Examiner—Albert W. Davis, Jr.
Attorney, Agent, or Firm—Jay M. Cantor

[57] ABSTRACT

A system for cooling a substrate via a continuous enclosed path within the substrate that passes closely adjacent heat producing components on or adjacent the substrate. According to a first embodiment, heat, where located on the substrate, is transmitted to a heat sink in the vapor phase by a change in phase of a liquid in the path to a vapor, thereby creating little change in temperature from heat source to heat sink and maintaining the substrate and components at substantially the same substantially constant temperature. According to a second embodiment, heat is removed by a circulating conductive liquid in the continuous enclosed path which takes up heat at the sources and removes the heat at a sink in the path. The conductive liquid is part of a magnetohydrodynamic (MHD) cooling system wherein, at one location in the path, a current is applied to the liquid orthogonal to the path and a magnetic field is applied orthogonal to the path and the current flow to create a force on the conductive liquid along the path.

16 Claims, 6 Drawing Figures

1

SUBSTRATE COOLING

CROSS REFERENCE TO PRIOR APPLICATION

This application is a division of my application Ser. No. 468,665, filed Feb. 22, 1983, now abandoned, which is a continuation-in-part of my prior application, Ser. No. 174,929 filed Aug. 4, 1980 now U.S. Pat. No. 4,374,457 granted Feb. 22, 1983.

BACKGROUND OF THE INVENTION

1. Field of the Invention

This invention relates to cooling of substrates and heat producing components in contact therewith and to a heat transmission technique therefor.

2. The Prior Art

Removal of heat from substrates and particularly from the heat producing components in contact therewith and adjacent thereto has presented a serious problem to the electronics art. This problem has been handled by normal heat transmission due to conduction and the like. However, heat removal by this method is limited and therefore limits component density when heat build-up becomes a serious problem. Heat removal density has been increased by the use of fans to blow air over the components, operation in a cool atmosphere and the like. However, even these methods do not provide sufficiently high amounts of heat removal to greatly minimize the problems presented by high component packing densities. The above noted application presents a new and significantly superior approach to heat removal by the introduction of heat transmission paths within a substrate, closely adjacent the heat producing components to greatly increase the degree of heat removal relative to prior art methods. However, it is desired to even further increase the amount of heat removed as well as to provide an inexpensive, self-contained heat transmitter within the substrate.

SUMMARY OF THE INVENTION

In accordance with the present invention, the above sought advantages are achieved and there is provided a self-contained heat transmitter within the substrate cooling aperture of the above noted application which is capable of removing greater quantities of heat relatively inexpensively. In accordance with one embodiment of the invention, heat pipe technology is utilized. In this technique, the heat conducting aperture is configured as a heat pipe. One of the outstanding characteristics, from a functional standpoint, is that a heat pipe can be considered to be (which in fact it closely approximates) a thermal super conductor which has a small, essentially fixed, temperature drop across its boundaries up to its limit of thermal conduction.

The principle of operation of a heat pipe is to have a closed channel in which the walls are made of a porous material, called a wick, that readily conducts liquid by capillarity. A liquid of low surface tension that readily wets the wick is introduced into the heat pipe through the fill channel and the fill channel is closed. The amount of liquid introduced is not sufficient to fill the heat pipe but is only sufficient to wet the wick with a small surplus so that the center region of the heat pipe is not filled with liquid.

When one end of the heat pipe has heat applied to it, the liquid in the wick vaporizes, removing heat by the amount required for the latent heat of vaporization for the liquid. The vapor moves to the center of the heat pipe and down its length to the cool end where it condenses back to the liquid phase and again wets the wick. The wick continuously transports liquid back to the hot region, replacing the vaporized liquid. As the heat input (Cal/sec) increases, the temperature at the hot end does not increase, only the rate of vaporization increases. This situation exists up to the limit of the ability of the wick to transport liquid back to the hot zone. Note that the operation is not gravity dependent so that the device will also operate in space applications.

Heat pipes are well known in the art of thermal conduction technology and the attributes of heat pipes will not be further discussed here. Suffice it to say that the ability of the heat pipe to conduct heat over long distances with essentially no temperature drop makes this a very useful characteristic for electronic and electrical applications.

In accordance with this embodiment, a wicking agent is formed on the interior walls of the heat sink aperture of the subject application. A liquid of low surface tension that readily wets the wick and which vaporizes at a predetermined temperature, which is at about the maximum temperature at which the heat producing components are to operate, is introduced into the aperture in an amount insufficient to fill the aperture and the apertures is then sealed off from the environment. Freon TF is a preferred liquid. The substrate, if cooled at one end of the aperture, will act as a heat sink by attracting the vaporized material within the aperture to said cooled end and condensing the vapor to permit it to travel by capillarity through the wick.

In accordance with a second embodiment of the invention, a liquid conductor pump is utilized.

Liquid conductors, especially liquid metals, have been used in the past as high energy density heat transfer media. "Crossed fields" or magnetohydrodynamic (MHD) devices have been employed in cooling or heat transfer loops in the past and are well known in the heat transfer art. In these systems, liquid metals such as mercury or NaK (sodium-potassium eutectic alloy) have an electric current passed through them and simultaneously are situated in a magnetic field that is orthogonal to the direction of electric current flow. Thus a force is exerted on the liquid metal that can act as if it were a circulating pump.

The cooling aperture in the above noted application is in the form of a loop and is completely filled through the fill tube with a liquid metal, considered here as mercury. The fill tube must have a flexible seal in order to allow for the difference in cubic coefficient of expansion between the substrate material and the mercury.

When a current is applied to the mercury in the aperture at the pump, a force is exerted on the mercury so that the mercury will circulate around the aperture loop. The magnitude of the force is proportional to the electric current, the length of conductor, and the magnetic field strength. The electric current can be supplied from the electric power input to the circuit on the substrate so that, as the circuit draws more current, hence, dissipates more heat, the force exerted on the mercury will increase to automatically provide for increased cooling capacity.

DESCRIPTION OF THE PREFERRED EMBODIMENTS

Figure 1:
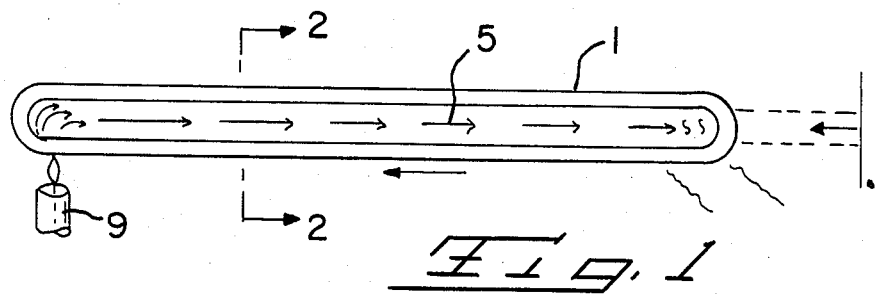
FIG. 1 is a schematic diagram of a heat pipe as used in accordance with the present invention.
Figure 2:
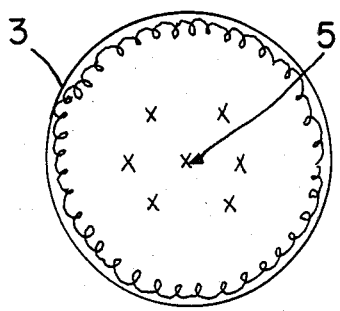
FIG. 2 is a cross-section along the line 2—2 of FIG. 1.

Referring to FIGS. 1 and 2, there is shown a heat pipe. The heat pipe is an enclosed conduit 1 having a wick 3 on the surface of the interior walls of the conduit and a liquid of low surface tension therein which travels along the wick by capillarity and which vaporizes at predetermined temperature, according to the liquid used, the vapor 5 moving to the center of the conduit. As can be seen, a fill channel 7 is provided for filling the conduit 1 with the liquid and is then sealed. A heating device 9 is shown at one end of the conduit to represent heat having been added anywhere along the outer heat pipe wall. The end of the conduit adjacent fill channel 7 is cooled to cause condensation of the vapor and remove heat.

As can be seen, liquid, such as Freon TF is placed within the conduit 1 in an amount to leave space, the liquid being taken into the wick 3 and moving along the entire interior surface of the conduit within the wick. When a region or regions of the conduit are heated to a temperature above the boiling point of the liquid, as at heater 9, the liquid will vaporize and travel to the center of the conduit. Meanwhile, new liquid will replace the vaporized liquid partly due to condensation at the cold end of the conduit, the vapor travelling to the cold end of the conduit to replace the condensed vapor at that end. It can be seen that the liquid is continually recycled to vapor and back.

Figure 4:
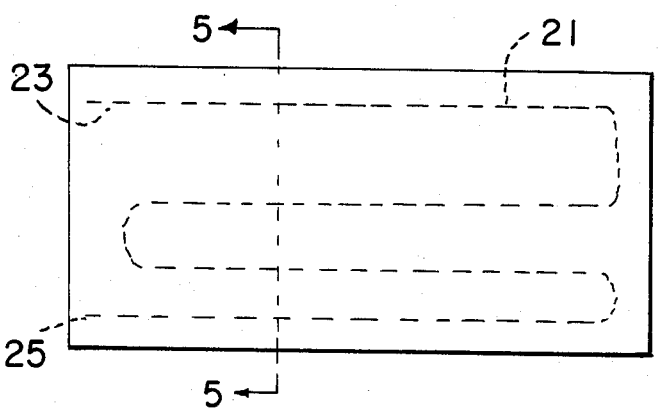
FIG. 4 is a top view of a substrate showing a cooling aperture therein having an entrace and an exit.
Figure 5:
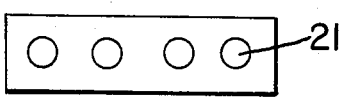
FIG. 5 is a view taken along the line 5—5 of FIG. 4.
Figure 6:
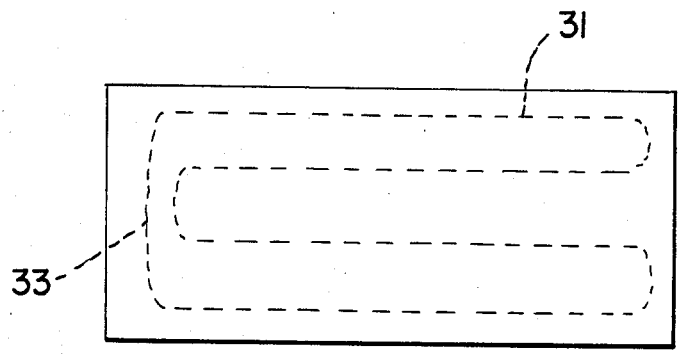
FIG. 6 is a top view of a substrate showing a cooling aperture therein having a single entrance-exit.

Referring now to FIGS. 4 to 6, the apertures 21 and 31, which correspond to the aperture 9 of the above noted application, become the heat pipe and are configured in the same manner as FIGS. 1 and 2. In FIGS. 4 and 5, the inlets 23 and 25 are sealed after the liquid has been entered. Cooling takes place at either one or both of the inlets 25, such as by refrigeration, running cold water over the conduit end, air cooling or the like. In FIG. 6, cooling will take place only at inlet 33 after entry of the liquid and sealing of the inlet.

A heat pipe cooled substrate was constructed in the following manner:

1. A substrate with a cooling aperture, a round hole, was fabricated according to the method of the above noted application.

2. The aperture of the fired substrate was filled with "N" sodium silicate for later wetting of all internal surfaces. The "N" sodium silicate was drained, leaving the walls of the aperture wet with "N" sodium silicate. The substrate was vacuum dried overnight to dry the aperture, leaving a dried film of "N" sodium silicate on the surface of the aperture.

3. The substrate was then fired at a temperature of 600 degrees F. in air for ten minutes.

4. When the substrate was removed, the "N" sodium silicate was found to have formed a porous crust that adhered to the walls of the aperture, leaving a hole in the center of the aperture, thus forming a wick.

5. A quantity of Freon TF sufficient to fill the aperture about ¼ full was introduced into the aperture through the hole. The fill hole was sealed with a ceramic plug that was cemented in place with epoxy cement.

6. A 10 watt power resistor was cemented to the surface of the substrate over the "hot" end of the heat pipe as depicted in FIGS. 1 and 2. A thermocouple was cemented to the substrate in the immediate vicinity of the power resistor. As the electrical power input was increased to the power resistor, it was found that the temperature measured increased to a temperature of approximately 150 degrees F., after which it remained substantially constant up to the full 10 watt rating of the resistor.

7. A stream of cooling water was run over the "cool" end of the heat pipe as depicted in FIGS. 1 and 2 and the measured temperature remained substantially constant, although the remainder of the substrate became cooler as the water assumed the cooling load rather than the local air.

In the above described experiment, the aperture was sealed with epoxy. A more permanent seal is desired for most applications. A threaded seal with an "O" ring or a metallized region and a solder seal is preferred.

Figure 3:
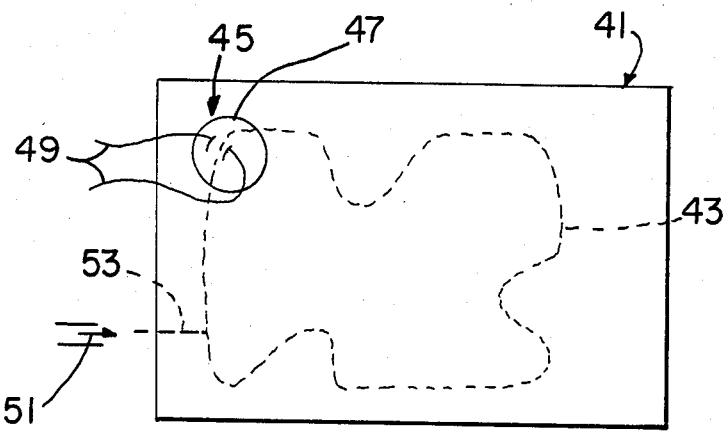
FIG. 3 is a schematic diagram of a substrate using MHD cooling.

FIG. 3 shows the top view of an MHD driven cooling system for a substrate 41. The dotted lines 43 are the top view of the aperture which is similar to the cooling aperture of the above noted application or the apertures of FIGS. 4 to 6 herein. The MHD pump 45 is located in the upper left corner in FIG. 3 and is shown as a magnet 47 and pair of electrodes 49 that make electric contact across the liquid conductor.

The cooling aperture in the above noted application is in the form of a loop and is completely filled through the fill tube 51 with a liquid metal, considered here as mercury. The fill tube must have a flexible seal 53 in order to allow for the difference in cubic coefficient of expansion between the substrate material and the mercury.

When a current is applied to the mercury in the aperture 43 at the pump 45, a force is exerted on the mercury so that the mercury will circulate around the aperture loop 43. The magnitude of the force is proportional to the electric current, the length of conductor, and the magnetic field strength. The electric current can be supplied from the electric power input to the circuit on the substrate so that, as the circuit draws more current, hence, dissipates more heat, the force exerted on the mercury will increase to automatically provide for increased cooling capacity.

A coolant can be applied along the path 43 to remove heat from the mercury such as at fill tube 51 in the same manner as discussed above for the first embodiment.

Many other possibilities exist in utilizing the cooling aperture for cooling:

1. The aperture can be a continuous passage or passages through the substrate. A cooling fluid can be forced through the passageway to remove waste heat. The fluid can also be utilized as a heating fluid to stabilize the temperature of the substrate in cold ambient conditions.

2. The aperture can be filled with a high conductivity material so that heat can be removed by pure conduction.

3. The aperture can be filled with a material that undergoes an endothermic change at a fixed temperature so that a great deal of heat can be absorbed for a short period of time. A typical phenomenon such as the heat of liquifaction at the melting point can be used or various decomposition reactions. This is of use where the circuit is exposed to high heat loads for short periods of time such as on space re-entry.

4. The aperture system could be used as a refrigeration holding plate in which it can be charged, either continuously or intermittently, with a refrigerant that is caused to evaporate within the aperture system, thereby cooling the substrate. The vapor could be recycled or vented.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A system for temperature maintenance of a substrate having heat producing components secured thereto or closely adjacent thereto, comprising:
   (a) a molded substrate having a heat producing component receiving surface and an enclosed endless channel therein of predetermined configuration closely adjacent said surface;
   (b) an electrically conductive liquid within said channel;
   (c) a magnetohydrodynamic generator associated with said channel for moving said liquid around said channel; and
   (d) means for removing heat from said liquid.

2. A system as set forth in claim 1 wherein said liquid substantially fills said channel.

3. A system as set forth in claim 1 wherein said liquid is taken from the class consisting of mercury and sodium-potassium alloy.

4. A system as set forth in claim 2 wherein said liquid is taken from the class consisting of mercury and sodium-potassium alloy.

5. A system as set forth in claim 1 wherein said generator includes means for providing current flow orthogonal to said channel through said liquid and means for providing a magnetic field orthogonal to the direction of current flow and said channel across said channel and the situs of said current flow.

6. A system as set forth in claim 2 wherein said generator includes means for providing current flow orthogonal to said channel through said liquid and means for providing a magnetic field orthogonal to the direction of current flow and said channel across said channel and the situs of said current flow.

7. A system as set forth in claim 3 wherein said generator includes means for providing current flow orthogonal to said channel through said liquid and means for providing a magnetic field orthogonal to the direction of current flow and said channel across said channel and the situs of said current flow.

8. A system as set forth in claim 4 wherein said generator includes means for providing current flow orthogonal to said channel through said liquid and means for providing a magnetic field orthogonal to the direction of current flow and said channel across said channel and the situs of said current flow.

9. A system as set forth in claim 1 wherein said substrate is a ceramic substrate.

10. A system as set forth in claim 2 wherein said substrate is a ceramic substrate.

11. A system as set forth in claim 3 wherein said substrate is a ceramic substrate.

12. A system as set forth in claim 4 wherein said substrate is a ceramic substrate.

13. A system as set forth in claim 5 wherein said substrate is a ceramic substrate.

14. A system as set forth in claim 6 wherein said substrate is a ceramic substrate.

15. A system as set forth in claim 7 wherein said substrate is a ceramic substrate.

16. A system as set forth in claim 8 wherein said substrate is a ceramic substrate.

* * * * *